United States Patent [19]

Nemoto et al.

[11] 4,410,562
[45] Oct. 18, 1983

[54] METHOD FOR FORMING A CURED RESIN COATING HAVING A DESIRED PATTERN ON THE SURFACE OF A SUBSTRATE

[75] Inventors: Yuhei Nemoto, Tokyo; Shiro Takahashi, Ohmiya, both of Japan

[73] Assignee: Dainippon Ink and Chemicals, Inc., Tokyo, Japan

[21] Appl. No.: 324,651

[22] Filed: Nov. 24, 1981

[30] Foreign Application Priority Data

Nov. 29, 1980 [JP] Japan .................. 55-168295

[51] Int. Cl.³ ............................ B05D 3/06
[52] U.S. Cl. .................. 427/54.1; 427/259; 427/264; 427/270; 427/272; 430/5; 430/262
[58] Field of Search .......... 427/54.1, 272, 259, 427/264, 270; 430/5, 262

[56] References Cited

U.S. PATENT DOCUMENTS

| 2,316,148 | 4/1943 | Bassist | 430/5 |
| 3,002,848 | 10/1961 | Clark | 427/270 |
| 3,129,096 | 4/1964 | Collinson et al. | 430/5 |
| 3,139,352 | 6/1964 | Coyner | 427/264 |
| 3,713,935 | 1/1973 | Grecchi | 427/54.1 |
| 3,853,576 | 12/1974 | Netznik | 427/264 |
| 3,853,578 | 12/1974 | Suzuki et al. | 427/54.1 |
| 4,115,602 | 9/1978 | Bullard | 427/264 |
| 4,254,163 | 3/1981 | Piazza | 427/259 |

Primary Examiner—John H. Newsome
Attorney, Agent, or Firm—Sherman & Shalloway

[57] ABSTRACT

A method for forming a cured resin coating having a desired pattern on the surface of a substrate, which comprises a first step of applying a coating of an ultraviolet light-curable resin to the surface of the substrate;

a second step of pre-curing said coating by irradiating ultraviolet light thereto;

a third step of applying a printed layer of a predetermined pattern partly to the surface of the precured coating with a light-insensitive non-transparent printing ink;

a fourth step of irradiating ultraviolet light to the product obtained in the third step to cure completely that part of the pre-cured coating on which the printed layer is absent, while that part of the pre-cured coating which exists beneath the printed layer is maintained intact; and dissolving or peeling the printed layer and the pre-cured layer existing beneath it, whereby the resin coating having the desired pattern which is in a complementary relation to the pattern of said printed layer is formed on the surface of the substrate.

1 Claim, 7 Drawing Figures

METHOD FOR FORMING A CURED RESIN COATING HAVING A DESIRED PATTERN ON THE SURFACE OF A SUBSTRATE

This invention relates to a method for forming a cured resin coating having a desired pattern on the surface of a substrate.

With a striking increase in recent years in the production of IC and LSI, there has been an increasing demand for lead frames and film carriers for mounting these electronic elements and connecting and wiring their terminals. In addition, connectors or connecting terminals of various shapes are being produced in great quantities because they are essential to various kinds of electronic component parts or electronic instruments and appliances.

Substrates for lead frames or connectors are made of phosphor bronzes, beryllium copper, nickel silvers, stainless steel, etc., and to insure complete electrical contact and long-term durability of the connecting or contacting parts of terminals of elements, plating of silver, gold and other noble metals is essential.

It has been the previous practice to apply noble metal plating to the entire surface of such a substrate, punch the plated substrate into a suitable shape during the mounting or production of elements, and then recover the plated noble metal from the unwanted parts. However, for saving resources and simplifying the process steps, it is desirable to make electronic component parts from those substrates which are plated in a desired pattern only at specified parts of small area which are to be bonded or contacted.

These substrates have heretofore been supplied in the form of metal strips when they are intended for the discontinuous manufacture of such electronic component parts. In order to produce them efficiently on a mass-production basis by a continuous process, such substrates should be supplied in the form of a long roll of strip.

The present invention provides means for meeting these requirements.

In order to produce a long roll of metal strip plated in a desired pattern, it is necessary to mask at least one surface of the metal strip with a resin coating having a pattern which is complementary to the pattern to be placed. Formation of a resin coating having such a complementary pattern on the substrate may be effected by bonding a masking material for masking the pattern to be plated to a substrate and thereafter coating the entire surface of the substrate with a resist coating composition. The manufacturing process according to this method requires large equipment or man power and much time.

A printing technique would be available for applying the resist coating composition to the substrate in the complementary pattern. However, by an ordinary printing technique, the thickness of the resist coat inevitably becomes thin, and it is difficult to ensure a sufficient resist effect. The thickness of the resist coat would become sufficient if a screen printing method is used. But this method cannot provide an elaborate pattern.

These problems are not limited to the formation of a plated pattern in the production of electronic component parts, but arise commonly when an elaborate pattern is desired in the making of printed circuit boards, or in the processing of the surfaces of various substrates such as metals, plastics, ceramics, glass, and wood by various physical or chemical means such as plating, etching, honing, coloring and modification.

It is an object of this invention therefore to provide a method for forming on various substrates a cured resin coating having an elaborate pattern and a sufficient resisting effect.

According to this invention, the above object is achieved by a method for forming a cured resin coating having a desired pattern on the surface of a substrate, which comprises a first step of applying a coating of an ultraviolet light-curable resin to the surface of the substrate;

a second step of pre-curing said coating by irradiating ultraviolet light thereto;

a third step of applying a printed layer of a predetermined pattern partly to the surface of the pre-cured coating with a light-insensitive non-transparent printing ink;

a fourth step of irradiating ultraviolet light to the product obtained in the third step to cure completely that part of the pre-cured coating on which the printed layer is absent, while that part of the pre-cured coating which exists beneath the printed layer is maintained intact; and dissolving or peeling the printed layer and the pre-cured layer existing beneath it, whereby the resin coating having the desired pattern which is in a complementary relation to the pattern of said printed layer is formed on the surface of the substrate.

The individual steps of the method of this invention are described below in detail with reference to the accompanying drawings in which.

FIRST STEP

Figure 1:
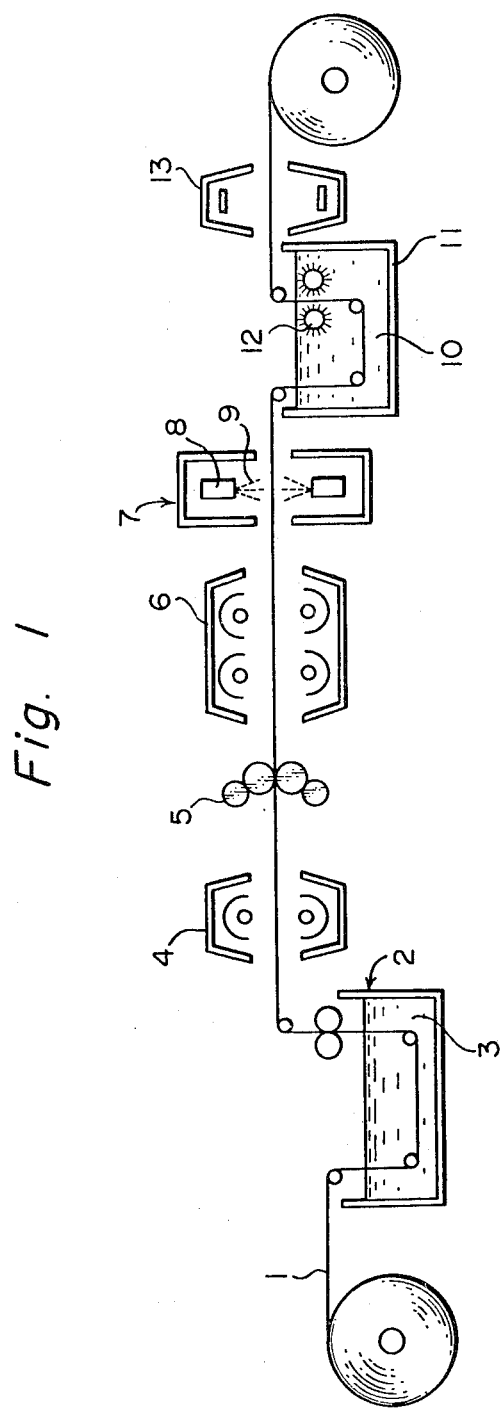
FIG. 1 is a diagrammatical side view showing the entire steps of the method of this invention.

Referring to FIG. 1, a substrate 1, for example a sheet or film made of such a material as metals or plastics is disposed at a starting end of a continuous manufacturing line for producing a long roll of strip, and is continuously delivered to the line. Both surfaces of the substrate 1 are entirely coated by a coating device 2 with an ultraviolet light-curable resin paint 3 having a resist effect. In the drawing, both surfaces of the substrate 1 are coated by using a dipping-type coating device, but whether to coat one or both surfaces of the substrate may be properly determined depending upon the end use of the final pattern. Accordingly, the coating device 2 that can be used in this invention is not limited to the illustrated embodiment, and various devices such as a roll coater, a knife coater or a spray coater capable of coating one or both surfaces can be used. Furthermore, in the illustrated embodiment, the substrate is a continuous structure, but it may also be a discontinuous structure such as a plate or sheet. In the latter case, the material which makes up the substrate may also be glass or ceramics. When a discontinuous substrate is used, a part of the manufacturing line such as the coating device and a transportation device may be changed in design to conform to the discontinuous substrate. The ultraviolet light-curable paint 3 has a resist effect against various processing techniques such as plating, soldering and etching, and can be formed by using various known ultraviolet light-curable materials and adjuvants. For example, an ultraviolet light-curable paint can be prepared by diluting a polymer or prepolymer of the acrylic, polyester, polyurethane, polyamide or epoxy series having at least two unsaturated bonds, preferably acrylic or methacrylic double bonds, polymerizable under the action of ultraviolet light per molecule with a monomer polymerizable under the action of ultraviolet light, preferably a polyol polyacrylate resulting from the reaction of one molecule of a polyhydric alcohol with at least two molecules of acrylic or methacrylic acid, and adding a known sensitizer or as required, a coloring pigment, an extender pigment, and various adjuvants to adjust the viscosity of the dilution to a right one.

Usually, a resist film required to have a thickness of 8 to 15 $\mu$m is formed by coating this paint at a line speed of 20 to 50 m/min.

SECOND STEP

Figure 2:
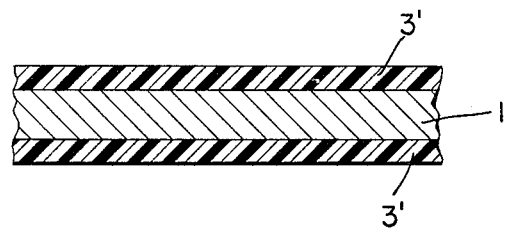
FIGS. 2, 3, 4 and 5 are sectional rough views of the products obtained by the second, third, fourth and fifth steps of the method of the invention, respectively.

The substrate 1 coated in the first step is then introduced into a primary ultraviolet irradiating device 4 to irradiate ultraviolet light to the coating of the paint 3. Thus, as shown in FIG. 2, a pre-cured coating 3' is formed on the substrate 1. In this step, the degree of curing of the pre-cured coating 3' is important. It is necessary to adjust curing to such an extent as to permit the printing in the third step and the dissolving and peeling of the printed layer and the coating beneath it in the fourth step. It is easy to adjust the pre-curing to the required degree of curing if the irradiating conditions are pre-scribed by considering the intensity of ultraviolet irradiation, the thickness of the coating, the curability of the paint, the line speed, etc.

THIRD STEP

Figure 3:
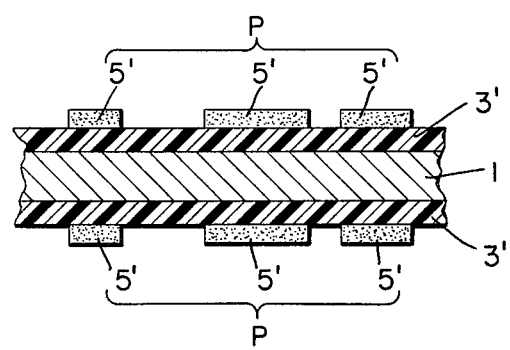

By using a printing device 5, a light-insensitive non-transparent ink having the ability to shield ultraviolet light is applied in a predetermined pattern P to the coating 3' pre-cured in the second step, as shown in FIG. 3. Thus, a printed layer 5' is formed on the pre-cured coating. The printing is done preferably by a rotary relief or lithographic offset printing method. The printing ink desirably used in this invention is generally a sheet relief ink or a sheet lithographic ink containing 15 to 20% by weight of carbon black.

Intaglio and gravure printing methods may also be available. But because the cost of making plates having different patterns for the individual lots is high, such printing methods are economically disadvantageous.

In the method of this invention, therefore, relief printing and lithographic printing are suitable. Commercially available plates such as photosensitive resin relief plates, photosensitive flexographic plates, lithographic PS plates, paper masters and waterless lithographic plates can be utilized in this invention.

When the substrate is in the form of a sheet or block, a negative or positive original is made according to a predetermined pattern and brought into contact with the aforesaid plate material, followed by exposure and development to make a printing plate. The printing plate is mounted on a printing press in accordance with the procedure of general lithographic or relief printing, and printing is performed on the pre-cured coating of the substrate.

When the substrate is in the form of a long roll or coil, it is generally desirable to print the pattern continuously. In this case, the relation expressed by the following formula should be exactly maintained between the pitch of the pattern and the diameter of the printing plate.

$$R = n \times (a/\pi)$$

wherein

R is the cylinder diameter of the required plate or rubber blanket cylinder, a is the pitch of the pattern, and n is the number of patterns obtained during one rotation of the plate.

In this case, a relief or lithographic plate is prepared by superimposing a negative or positive original having the pattern arrangement and size conforming to the diameter of the plate cylinder on an unexposed plate so that the image can be continuously printed with a predetermined pattern and pitch, exposing the plate to light and developing the exposed image thereby to form a positive image of the pattern.

The present inventors have ascertained that the desired pattern can be printed continuously by direct relief printing at a printing speed of 20 to 50 m/min. by exposing and developing a commercially available liquid or solid photosensitive resin plate on a plane, wrapping this plate accurately about the cylinder of a printing press by means of a dual surface-adhesive tape and connecting both ends of the plate carefully so that the gap between them is less than 0.5 mm.

Since the predetermined pattern should be continuously printed at a specified pattern pitch, the plate cylinder diameter R should be variable according to the pattern pitch so that R satisfies the equation $R = n \times (a/\pi)$.

FOURTH STEP

Figure 4:
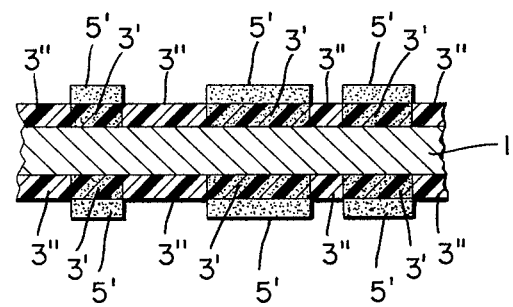

The substrate 1 having the printed layer 5' formed thereon in the third step is then introduced into a secondary ultraviolet irradiating device 6, and ultraviolet light is irradiated on the entire surface of the substrate 1. As a result of this ultraviolet irradiation, that portion 3" of the pre-cured coating which does not have the printed layer 5' thereon is completely cured as shown in FIG. 4, whereas that portion 3' of the pre-cured coating which has the printed layer 5' formed thereon is shielded from ultraviolet by the printed layer 5' and does not undergo photocuring reaction, with the result that the part 3' is still in the pre-cured state as in the second step.

FIFTH STEP

Figure 5:
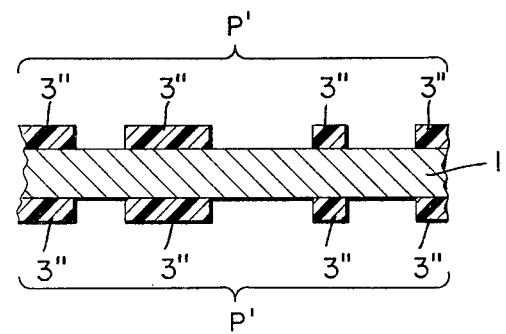

The substrate 1 which has undergone ultraviolet irradiation in the fourth step is then introduced into a developing device 7 having a jet nozzle 8. By jetting a developer solution 9 from the jet nozzle 8, the printed layer 5' and the pre-cured coating 3' beneath it are dissolved or peeled. Thus, there is left on the substrate the completely cured coating 3" having a pattern P' which is in a complementary relation to the predetermined pattern P (i.e., the pattern of the printed layer 5') formed by the printing ink, as shown in FIG. 5.

In the illustrated embodiment, the developing device used is of a jetting type, but the invention is not limited thereto. Various other types of developing devices, such as the one having a developing tank for dipping, can be used. The developer solution 9 is a suitable organic solvent which can dissolve or peel the printed portion of the substrate 1 and does not attack the completely cured coating. Examples are a mixture of ethyl acetate and trichloroethane, and trichloroethylene. Then, for finishing purposes, the substrate 1 having the completely cured coating 3" (the resist coating) having the complementary pattern P' left thereon is washed thoroughly with a cleaning agent 10 composed of trichloroethylene or another organic solvent, and dried by using a washing tand 11, a cleaning rotary brush 12, and a drier 13.

As stated hereinabove, the method of this invention makes it possible to form a resist coating 3" having a pattern P' which is in a complementary relation to the predetermined pattern P on the surface of the substrate in the form of a long roll or a sheet on a continuous production line. The method has very high utilitarian value and economic advantage because it forms the pattern P' of the resist coating 3" by utilizing the local differences of the ultraviolet light-cured coating in the degree of solubility or solvent resistance.

Figure 6:
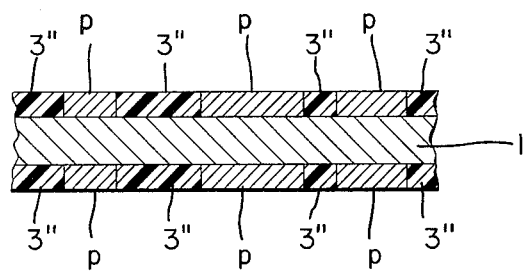
FIGS. 6 and 7 are sectional rough views illustrating the uses of the product of this invention.
Figure 7:
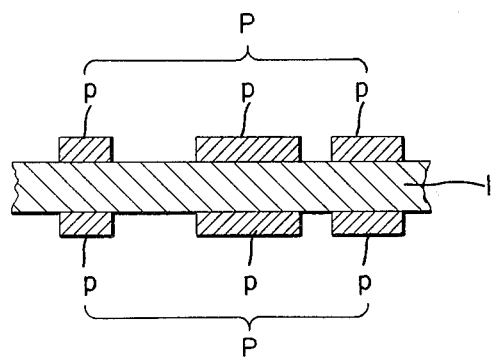

The product of this invention having the structure shown in FIG. 5 produced through the aforesaid steps is submitted to a plating step, as shown in the following Examples, for the production of electronic component parts. In the plating step, a plate layer p is formed on the exposed surface (that surface of the substrate 1 which does not have the resist coating 3") of the product of FIG. 5 as shown in FIG. 6. The product of FIG. 6 is treated with a suitable solvent to remove the resist coating 3". As a result, a product having a plated layer p with a predetermined pattern P is obtained on the surface of the substrate 1 as shown in FIG. 7.

The following examples illustrate the present invention specifically. The primary and secondary ultraviolet irradiating devices used in these examples had the following structures.

PRIMARY ULTRAVIOLET IRRADIATING DEVICE

Four ultraviolet light lamps are arranged both above and below the substrate being transferred at a predetermined speed. The distance between the substrate and a set of four lamps on each side is 14 cm. The lamps on each side are arranged at intervals of 10 cm, and the long axis of each lamp is at right angles to the transferring direction of the substrate. Each of the lamps has an output of 2 KW, and an effective lamp length of 150 mm.

SECONDARY ULTRAVIOLET IRRADIATING DEVICE

Five ultraviolet light lamps are arranged both above and below the substrate transferred at a predetermined speed. The distance between the substrate and a set of five lamps on each side is 10 cm. On each side, each lamp is spaced from an adjoining lamp with an interval of 10 cm, and the long axis of each lamp is at right angle to the transferring direction of the substrate. Each of the lamps has an output of 20 KW, and an effective lamp length of 150 mm.

EXAMPLE 1

The following experiment was run by using the production line shown in FIG. 1.

The line speed was preset at 20 meters/min. Both surfaces of a phosphor bronze strip (PBR 1H, a product of Mitsubishi Electric Co., Ltd.) were coated entirely to a thickness of 15 microns with an ultraviolet light-curable paint having a resist effect against plating (DAI-CURE pr, a product of Dainippon Ink & Chemicals, Co., Ltd.). The coated metal strip was passed through the primary ultraviolet irradiating device to pre-cure the coating. A predetermined pattern was then printed on both surfaces of the metal strip using a rotary relief printing press (a relief printing plate prepared from V10DIC U-82, a photosensitive resin made by Dainippon Ink & Chemicals Co., Ltd. was wrapped around the printing cylinder with a both surface-adhesive tape and the joint portion of the plate was sealed up with an epoxy adhesive) and a lithographic black printing ink (New Champion Apex Black, a product of Dainippon Ink & Chemicals Co., Ltd.). The metal strip was then passed through the secondary ultraviolet irradiating device at a speed of 20 m/min. to cure completely that part of the coating which was not printed with the black ink. The metal strip was then subjected to development using a stainless steel developing device including a solvent jet nozzle and a nylon brushing roll built therein and trichloroethylene as a developing solution. As a result of the developing, the printed layer and that part of the coating which was beneath the printed layer were removed. The surface of the metal strip was exposed to view in a pattern faithful to the pattern of the printed layer (in other words, a completely cured coating, i.e. resist coating, having a pattern complementary to the pattern of the printed layer was formed on the surface of the metal strip). The metal strip so developed was then dipped for 30 seconds at 70° C. in an alkaline solution at pH 11 containing sodium carbonate and sodium triphosphate, washed with water, and then electrolytically washed at 50° C. for 30 seconds at a voltage of 5 V and a current density of $4A/dm^2$ in an alkaline solution at a pH of 11 containing sodium carbonate and sodium triphosphate. After pickling, the coated substrate was plated in a silver strike bath for 6 seconds at 25° C. and a current density of 2 $A/dm^2$, and then plated in a silver cyanide bath at 25° C. and a current density of 4 $A/dm^2$ for 60 seconds.

The resist coating had a sufficient resist effect against the above washing and plating operations, and the coating was not at all peeled off. After the plating, the resist coating was peeled off by dichloromethane, and washed with water to obtain a metal strip plated with silver in the desired pattern.

EXAMPLE 2

The same ultraviolet light-curable paint as used in Example 1 was coated entirely to a thickness of 10 microns on both surfaces of an aluminum plate (300×400 mm) with a thickness of 0.3 mm by means of a roll coater. The coated plate was passed through the primary ultraviolet irradiating device at a speed of 20 meters/min. to pre-cure the coating. A predetermined pattern was printed on the pre-cured coating by means of a lithographic offset printing press and the same lithographic black ink as used in Example 1. The plate was then passed through the secondary ultraviolet irradiating device at a speed of 20 meters/min. to cure that part of the pre-cured coating which did not have the printed layer thereon, and then a coating having a pattern in a complementary relation to the pattern of the printed layer was formed by using the same developing device and the developing solution as used in Example 1. The plate was then electrolytically washed for 30 minutes in a 1% sodium hydroxide solution at 25° C. The plate was then washed with water. The aluminum plate was fixed to an anode and graphite was used as a cathode. The aluminum plate was thus anodized in an electrolytic bath containing 2% of oxalic acid by means of an ac current for 10 minutes at a current density of 1 A/dm$^2$ and a temperature of 25° C. Then, the aluminum plate was anodized in the same bath by a dc current for 30 minutes at a current density of 0.5 A/dm$^2$ and a temperature of 25° C. The anodized plate was washed with water, and boiled for 20 minutes in distilled water. After boiling, the resist coating was removed by dichloromethane, and washed with water to obtain an aluminum plate which was colored yellow in the desired pattern.

EXAMPLE 3

A laminate plate having one surface clad with copper was used. The same ultraviolet light-curable paint as used in Example 1 was coated to a thickness of 10 microns on the entire copper-clad surface of the laminate plate. The coated plate was then passed through the primary ultraviolet irradiating device at a speed of 20 meters/min. to pre-cure the coating. Then, a predetermined circuit pattern was printed on the pre-cured layer coating by using a lithographic offset printing press and the same lithographic black ink as used in Example 1. The plate was then passed through the second ultraviolet irradiating device at a speed of 20 meters/min. to cure that portion of the pre-cured coating which did not have the printed layer thereon. Then, the pattern was developed by using the same developing device as used in Example 1 with a developing solution composed of equal proportions of ethyl acetate and 1,1,1-trichloroethane.

The plate was dipped for 10 minutes in an etchant solution at 53° C. containing 20% of cupric chloride and 15% of conc. hydrochloric acid to etch the pattern portion. The etched plate was washed with water, and the resist coating was peeled off with ethylene dichloride to obtain a laminate plate in which the copper foil remained in circuit form. The resolution of a space between adjacent copper circuits was about 20 microns, and better than the resolution of that obtained by a screen printing method with an etching resist ink.

EXAMPLE 4

The same ultraviolet light-curable paint as used in Example 1 was coated to a thickness of 15 microns on the entire surfaces of a glass plate having a size of 40×100 mm with a thickness of 3 mm by means of a roll coater. The coated plate was passed through the primary ultraviolet irradiating device at a speed of 20 meters/min. to pre-cure the coating. A predetermined pattern was printed on the pre-cured coating by using a relief offset printing press (a relief printing plate prepared from V10DIC U-82, a photosensitive resin, was mounted on the plate cylinder) and the same lithographic black ink as used in Example 1. The same secondary ultraviolet irradiation and development as in Example 3 were carried out to form a glass plate having a resist pattern. Emery having a particle size of 60 was blown against the surface of this plate under a pressure of 5 kg/cm$^2$. The surface was washed with water and then the resist coating was removed by dichloromethane. The plate was again washed with water to obtain a decorative glass plate in which the pattern portion was roughened.

What we claim is:

1. A method for forming a cured resin coating having a desired pattern on the surface of a substrate, which comprises a first step of applying a coating of an ultraviolet light-curable resin to the surface of the substrate;

a second step of pre-curing said coating by irradiating ultraviolet light thereto;

a third step of applying a printed layer of a predetermined pattern partly to the surface of the pre-cured coating with a light-insensitive non-transparent printing ink;

a fourth step of irradiating ultraviolet light to the product obtained in the third step to cure completely that part of the pre-cured coating on which the printed layer is absent, while that part of the pre-cured coating which exists beneath the printed layer is maintained intact; and dissolving or peeling the printed layer and the pre-cured layer existing beneath it, whereby the resin coating having the desired pattern which is in a complementary relation to the pattern of said printed layer is formed on the surface of the substrate.

* * * * *